US008540289B2

(12) United States Patent
Nakatogawa et al.

(10) Patent No.: US 8,540,289 B2
(45) Date of Patent: Sep. 24, 2013

(54) OPENING/CLOSING STRUCTURE FOR CONTAINER FOR CONVEYING THIN PLATE

(75) Inventors: Takuji Nakatogawa, Ichihara (JP); Atushi Furutani, Kyoto (JP)

(73) Assignee: Vantec Co., Ltd., Tokyo (JP)

( * ) Notice: Subject to any disclaimer, the term of this patent is extended or adjusted under 35 U.S.C. 154(b) by 1312 days.

(21) Appl. No.: 11/921,156

(22) PCT Filed: May 31, 2006

(86) PCT No.: PCT/JP2006/310884
§ 371 (c)(1),
(2), (4) Date: Nov. 28, 2007

(87) PCT Pub. No.: WO2006/129715
PCT Pub. Date: Dec. 7, 2006

(65) Prior Publication Data
US 2009/0084785 A1    Apr. 2, 2009

(30) Foreign Application Priority Data

May 31, 2005  (JP) ................. 2005-158421

(51) Int. Cl.
*E05C 1/00*  (2006.01)
(52) U.S. Cl.
USPC ............................. 292/37; 292/32; 292/159
(58) Field of Classification Search
USPC .............. 292/37, 32, 159, 170, 169, 182, 140
See application file for complete search history.

(56) References Cited

U.S. PATENT DOCUMENTS

| | | | |
|---|---|---|---|
| 5,628,683 A | | 5/1997 | Gentischer |
| 5,711,427 A | * | 1/1998 | Nyseth ........................ 206/710 |
| 5,957,292 A | * | 9/1999 | Mikkelsen et al. ............ 206/710 |
| 6,105,782 A | * | 8/2000 | Fujimori et al. .............. 206/710 |
| 6,419,482 B1 | | 7/2002 | Sakata et al. |
| 6,457,598 B1 | * | 10/2002 | Hsieh et al. .................... 220/323 |
| 6,622,883 B1 | * | 9/2003 | Wu et al. ......................... 220/323 |
| 7,828,341 B2 | * | 11/2010 | Hasegawa et al. .............. 292/44 |
| 2004/0040884 A1 | | 3/2004 | Pai et al. |
| 2004/0232036 A1 | * | 11/2004 | Matsutori et al. ............. 206/710 |

FOREIGN PATENT DOCUMENTS

| | | |
|---|---|---|
| EP | 1 195 807 | 4/2002 |
| JP | 11-159218 | 6/1999 |
| JP | 3635061 | 1/2005 |
| JP | 2005-306411 | 11/2005 |
| KR | 10-1998-0012234 | 4/1998 |
| KR | 10-2004-0100905 | 12/2004 |
| WO | 01/06560 | 1/2001 |

OTHER PUBLICATIONS

International Search Report issued Aug. 22, 2006 in the International (PCT) Application of which the present application is the U.S. National Stage.
European Search Report issued Feb. 3, 2009 in the European Application No. EP 06756817.0.
Korean Office Action mailed Aug. 1, 2012 in Korean Patent Application No. 10-2007-7016128.

* cited by examiner

*Primary Examiner* — Kristina Fulton
(74) *Attorney, Agent, or Firm* — Wenderoth, Lind & Ponack, L.L.P.

(57) ABSTRACT

An opening/closing structure for a thin plate-conveying container has engagement recesses with which engagement projections are engageable. The engagement recesses are formed facing the engagement projections formed on a cover member of a lid of a rotation plate, both at an engagement rotation position and at a disengagement rotation position. The engagement rotation position is the position of the rotation plate for engagement of an engagement section of a lock member with a container body, and the disengagement rotation position is the position of the rotation plate for disengagement of the lock member from the container body.

11 Claims, 11 Drawing Sheets

OPENING/CLOSING STRUCTURE FOR CONTAINER FOR CONVEYING THIN PLATE

TECHNICAL FIELD

The present invention relates to an opening/closing structure for a thin plate-conveying container, which is used to accommodate, store, transfer or transport a thin plate such as a semiconductor wafer, a storage disk and a liquid crystal glass substrate or the like, and is used more particularly to accommodate a wafer having a large-diameter (300-mm wafer in particular) to be connected to a processing apparatus having a standard mechanical interface (SMIF or FIMS).

BACKGROUND ART

A conventional thin plate-conveying container for accommodating and conveying a semiconductor wafer includes a container body, a lid for closing an opening formed in the container body, and a lock mechanism for engaging the lid with the container body, with the opening of the container body being closed, in order to prevent dust from adhering to the semiconductor wafer. (For reference, see Japanese Patent Application Laid-Open Publication No. Hei 11-159218.)

The lock mechanism is composed of a latch mechanism including a latch plate that disengageably engages with the container body, and a rotatable rotation plate linked to the latch plate through a link arm member.

The rotation plate exerts a rotating force on the latch plate as an engaging force for engagement with the container body and as a disengaging force for disengagement from the container body. By rotational operation of the rotation plate, the engagement of the latch plate with the container body and the disengagement of the latch plate from the container body can be performed, and thereby the opening and closing of the opening of the container body can be carried out.

Incidentally, a structure using a cam mechanism between the rotation plate and an engagement pawl is also known. (For reference, see Japanese Patent Application Laid-Open Publication No. 2005-306411.)

However, the conventional opening/closing structure for the thin plate-conveying container is not provided with a device for holding the rotation plate at an engagement rotation position at which a lock member such as the latch plate is engaged with the container body and at a disengagement rotation position at which the lock member is disengaged from the container body.

Thus, when, during conveyance, vibrations for example are applied to the thin plate-conveying container having a semiconductor wafer accommodated therein, a problem arises where the rotation plate rotates and thus the lock member is disengaged from the container body.

Moreover, when the rotation plate is rotated for the disengagement of the lock member from the container body, it is difficult to determine whether or not the disengagement of the lock member from the container body is completed. This renders impossible the complete disengagement of the lock member from the container body. When the lid is removed from the container body with the lock member incompletely disengaged from the container body, a problem arises where damage to the lock member, the container body, and the lid is caused by the lock member being caught in the container body.

SUMMARY OF THE INVENTION

An object of the present invention is therefore to provide an opening/closing structure for a thin plate-conveying container, which is capable of holding the rotation plate both at the engagement rotation position where the lock member is engaged with the container body and at the disengagement rotation position where the lock member is disengaged from the container body. This arrangement achieves a reduction, by making a low-friction place extremely small during the opening/closing operation, in the occurrence of dust; achieves simplification of the opening/closing structure that would otherwise have a complicated mechanism and a high parts count; achieves simplification of manual opening/closing operation; and achieves facilitation of the assembly and disassembly of lid opening/closing structure parts.

In order to achieve the above object, an opening/closing structure for a thin plate-conveying container according to one embodiment of the present invention includes a container body having an opening; a lid removably attached to the container body for closing the opening of the container body; and a lock mechanism, provided on the lid, for engaging the lid with the container body with the opening of the container body closed. The lock mechanism includes a link mechanism including a rotation plate rotatably provided on the lid, a lock member that releasably engages with the container body, and a link arm member that serves to exert on the lock member a rotating force of the rotation plate linked to the lock member through the link arm member, in order that the rotating force acts as an engaging force for engagement with the container body and as a disengaging force for disengagement from the container body; and a holding device for holding rotation of the rotation plate in a stopped state both at an engagement rotation position and at a disengagement rotation position, the holding device being disposed between the rotation plate and the lid. The engagement rotation position is the position of the rotation plate at which, when the lock member is engaged with the container body by the rotation of the rotation plate, the link arm member and the lock member are stopped as aligned end to end on a straight line including the axis of rotation of the rotation plate. The disengagement rotation position is the position of the rotation plate at which the lock member is disengaged from the container body.

With the above structure, the holding device provided between the rotation plate and the lid ensures that the rotation plate is held at the engagement rotation position for the engagement of the lock member with the container body and at the disengagement rotation position for the disengagement of the lock member from the container body.

At this point, the engagement rotation position can be such that, for the engagement of the lock member with the container body, the link arm member and the lock member are stopped as aligned end to end on a straight line including the axis of rotation of the rotation plate.

Thus, even if external forces are applied to the lock member, the external forces are transmitted in straight lines to the rotation plate through the link arm member, and thus a force that causes rotation of the rotation plate does not develop. This prevents the rotation plate from easily rotating and moving from the engagement rotation position and from the disengagement rotation position.

Hence, this enables maintaining, with stability, the lock member as engaged with the container body and the lock member as disengaged from the container body.

Thus, for example even if, during conveyance, vibration or shock due to falling is applied to the container having a semiconductor wafer accommodated therein, the rotation plate is reliably held at the engagement rotation position. This prevents the rotation and movement of the rotation plate to the disengagement rotation position due to the vibration.

Hence, this enables preventing the disengagement of the lock member from the container body due to the vibration being applied to the container.

The rotation plate is held by the holding device at the engagement rotation position and at the disengagement rotation position. Thus, when the rotation plate is rotated for the engagement of the lock member with the container body and for the disengagement of the lock member from the container body, whether or not the engagement and disengagement of the lock member with and from the container body are completely done can be easily checked by a click made by the lock member being locked, or a change in a resisting force under operation.

This enables reliably checking the engagement of the lock member with the container body, and also prevents the lid from being erroneously removed from the container body with the lock member incompletely disengaged from the container body.

This enables preventing damage to the lock member, the container body and the lid, such as has been conventionally caused by the lock member being caught in the container body at the time of removal of the lid from the container body.

Moreover, the container is prevented from being conveyed with the lock member incompletely engaged with the container body. This eliminates the removal of the lid from the container body during conveyance, and thus enables preventing a semiconductor wafer from being contaminated due to dust entering the container due to the removal of the lid.

EXPLANATION OF REFERENCE NUMERALS

1 . . . opening/closing structure for container, 12 . . . opening, 13 . . . container body, 14 . . . lid, 15 . . . lock mechanism, 18 . . . engagement bore, 20 . . . lid body, 21 . . . recess, 21e . . . opening edge (opening edge of recess), 22 . . . engagement hole, 25 . . . cover member, 26 . . . engagement pawl, 27 . . . disengagement recess, 28, 128 . . . lock member, 29 . . . link arm member, 30 . . . rotation plate, 31, 131 . . . engagement section, 32 . . . connection section, 37 . . . finger inserting aperture, 39 . . . moving device, 40 . . . lock member inclined section, 41 . . . lid inclined section, 42 . . . holding device, 43 . . . engagement projection, 44a, 44b . . . engagement recess

DETAILED DESCRIPTION OF THE INVENTION

The best mode of the present invention will be described in detail below with reference to illustrated embodiments for carrying out this invention.

[First Embodiment]

Figure 1:
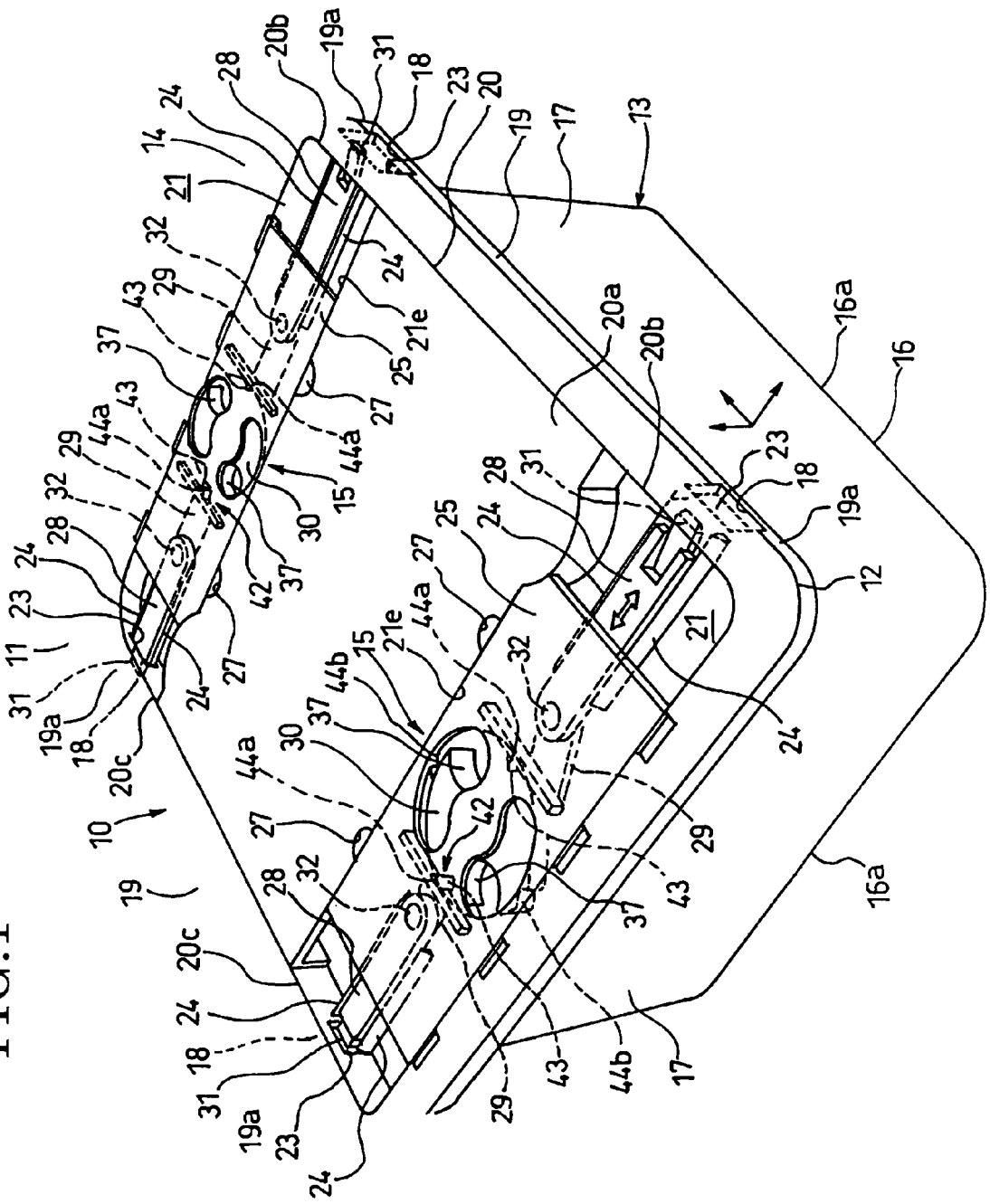
FIG. 1 is a perspective view showing, in schematic form, an opening/closing structure for a thin plate-conveying container according to the present invention.

FIG. 1 shows an embodiment of an opening/closing structure 11 according to the present invention as applied to a thin plate-conveying container 10 for accommodating and conveying a thin plate, for example, a semiconductor wafer. This opening/closing structure, of course, may be applied to other containers.

As shown in FIG. 1, the thin plate-conveying container 10 according to the present invention includes a container body 13 having an opening 12 provided at the top, a lid 14 for closing the opening 12 of the container body in a hermetically sealed fashion, and a pair of lock mechanisms 15 for engaging the lid 14 with the container body 13 with the opening 12 of the container body 13 closed in a hermetically sealed fashion.

The container body 13 and the lid 14 are molded of a resin material such as polycarbonate, polybutylene terephthalate, and polyetheretherketone.

As shown in FIG. 1, the container body 13 includes a bottom wall 16 that is a rectangular configuration in plan, and four sidewalls 17 erected on edges 16a of the bottom wall. In FIG. 1, there are shown two adjacent sidewalls of the four sidewalls 17.

Of the four sidewalls 17, a pair of the sidewalls 17, facing each other, each have a pair of engagement bores 18 formed therein, in which lock members 28 (to be described later) of the lock mechanisms 15 engage.

In the illustrated embodiment, the engagement bores 18 are formed at both ends 19a of a top 19 of the sidewall 17 in such a manner that the engagement bores 18 face each other across the pair of the sidewalls 17.

Figure 8A:
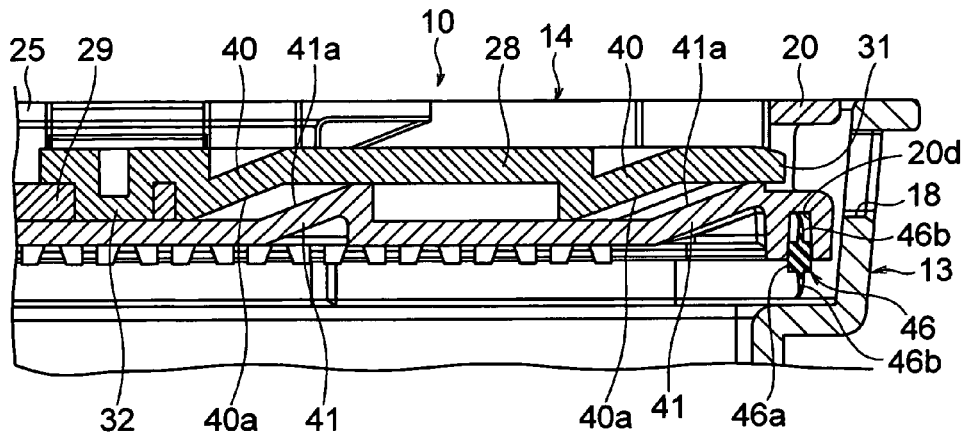
FIG. 8A is a longitudinal sectional view showing the lock member of the opening/closing structure according to the present invention, as being in its initial position.

In the illustrated embodiment, the engagement bore 18 is of a size such that the lock member 28 can be inserted thereinto, and the engagement bore 18 is integrally molded with a flange provided on the periphery of the opening 12 of the container body 13. Thereby, the engagement bore 18 is set so that the area of an upper edge 18a of an inner circumferential surface thereof is larger than the areas of other, side and lower edges, as shown in FIG. 8A.

The lid 14 includes a lid body 20 in plate form, which can be fitted in the opening 12 of the container body 13.

Figure 2:
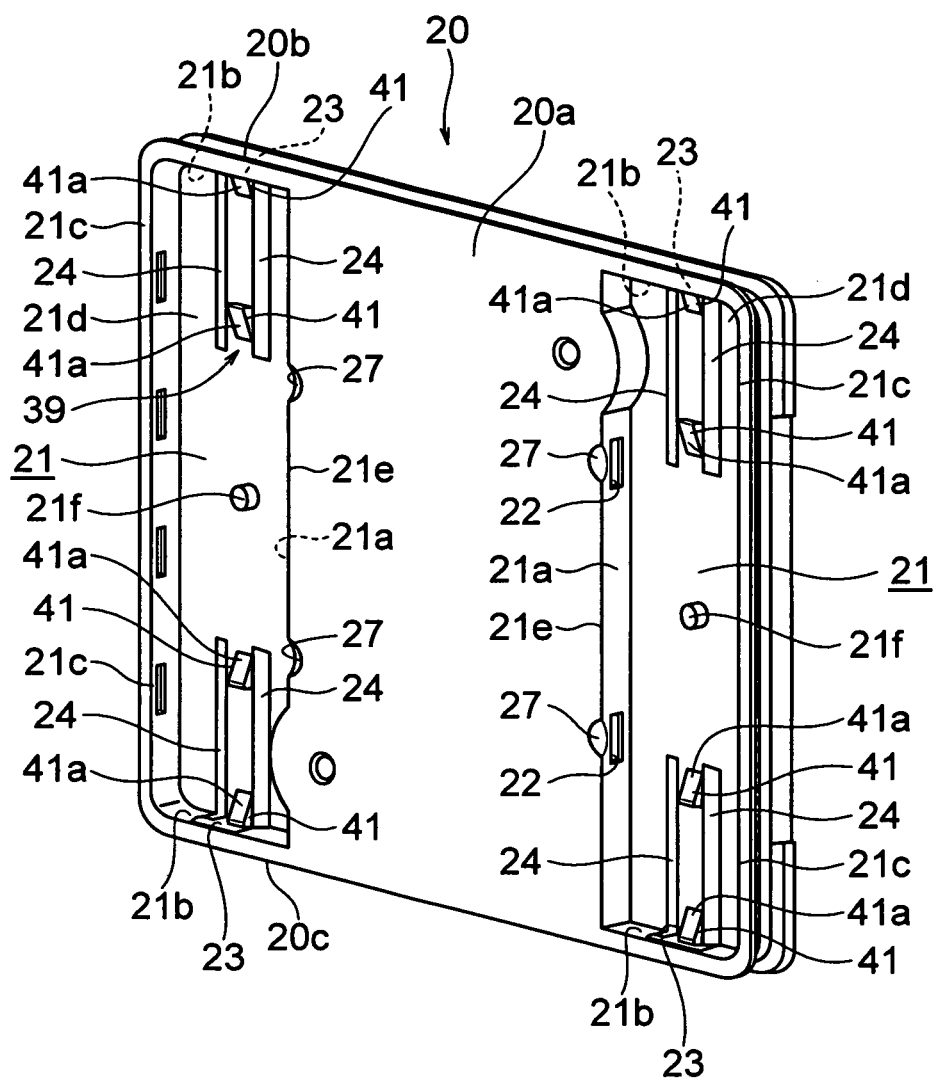
FIG. 2 is a perspective view showing, in schematic form, a lid body of the opening/closing structure according to the present invention.

The lid body 20 has a pair of recesses 21 formed in its top surface 20a, which serve to accommodate the lock mechanisms 15. As shown in FIGS. 1 and 2, the recesses 21 are formed in the lid body 20 in such a manner that the recesses 21 are rectangular configurations in plan and, in the lid body 20 as fitted in the opening 12, the recesses 21 extend from edges 20b of the lid body 20 facing one of the pair of the sidewalls 17 of the container body 13 to edges 20c of the lid body 20 facing the other sidewall 17 and also extend along a line connecting the engagement bores 18 facing each other across the pair of the sidewalls 17.

As shown in FIG. 2, each recess 21 has a pair of engagement holes 22 formed in its circumferential wall 21a located inwardly of the lid body 20, in which engagement pawls 26 (described later) of cover members 25 (described later) engage.

The recess 21 also has insertion bores 23 formed in its circumferential walls 21b facing the sidewalls 17 of the container body 13, the insertion bores 23 being located in places corresponding to the engagement bores 18 formed in the sidewalls 17 of the container body 13. The insertion bores 23 are configured so that the lock members 28 (to be described later) of the lock mechanism 15 are inserted therethrough.

The recess 21 further has a pair of guide rails 24 formed on its bottom surface 21d at both ends 21c in the extending direction of the recess 21, which guide a rectilinear movement of the lock members 28 (described later). The guide rails 24 extend in the extending direction of the recess 21 and are spaced in a direction at right angles to the extending direction.

The lid body 20 has a groove 20d formed in the underside thereof, which extends along the periphery thereof, and the groove 20d is provided therein with a ring-shaped gasket 46 for providing sealing between the lid body 20 and the opening 12 of the container body 13 (see FIGS. 8A to 8E).

The gasket 46 includes, in the groove 20d, a gasket body 46a fitted in a bottom surface of the groove 20d or equivalently clear of a top surface thereof, and a pair of elastically deformable seals 46b and 46b extending from the gasket body 46a to the top surface of the groove 20d and inwardly of the container body 13, respectively.

The lid 14 is configured so that the lid body 20 thereof is fitted in the opening 12 of the container body 13 with the gasket 46 in between and the seals 46b and 46b are elastically deformed by being forced upwardly and downwardly by engagement by the lock mechanisms, whereby the opening 12 of the container body 13 is closed in hermetically sealed fashion.

The lid 14 further includes a pair of cover members 25 formed on the lid body 20, which cover the recesses 21. As shown in FIG. 1, the cover member 25 is formed of a plate member extending along the recess 21, and covers the recess 21 with the recess opened at both the ends 21c.

Figure 3:
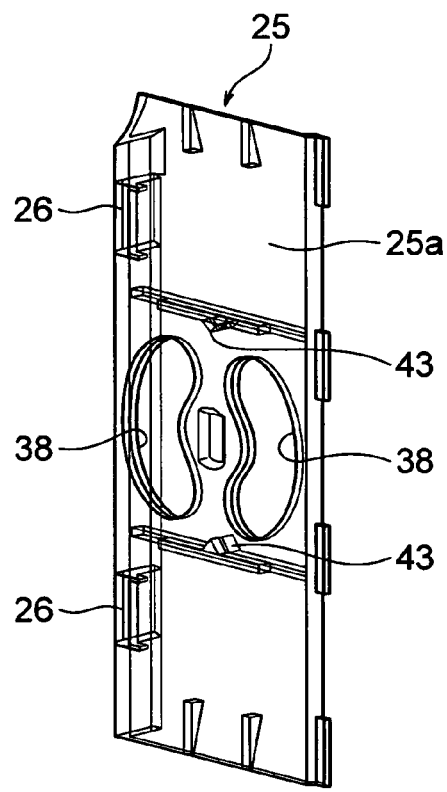
FIG. 3 is a perspective view showing, in schematic form, a cover member of the opening/closing structure according to the present invention.

As shown in FIG. 3, the cover member 25 has, formed thereon, a pair of the elastically deformable engagement pawls 26 that engage in the engagement holes 22 formed in the recess 21.

The cover member 25 is fixed to the lid body 20 by engagement of the engagement pawls 26 in the engagement holes 22.

In the embodiment shown in FIGS. 1 and 2, each of the recesses 21 of the lid body 20 has plural disengagement recesses 27 formed in its opening edge 21e, which serve for disengagement of the engagement pawls 26 from the engagement holes 22. The disengagement recesses 27 are formed in the opening edge 21e of the recess 21 in places corresponding to the engagement holes 22, as being opened inwardly of the recess 21 and upwardly of the lid body 20.

In the illustrated embodiment, the disengagement recess 27 is formed in such a manner that its inner surface has a spherical surface, and an inside diameter thereof is such that it permits insertion of an operator's finger (not shown).

As shown in FIG. 1, the lock mechanisms 15 each include a pair of the lock members 28 and 28 that engage with the container body 13, and a rotation plate 30 linked to the lock members 28 and 28 through a pair of link arm members 29 and 29. The pair of the link arm members 29 and 29 and the pair of the lock members 28 and 28 are symmetrically disposed with respect to the axis of rotation of the rotation plate.

Figure 4:
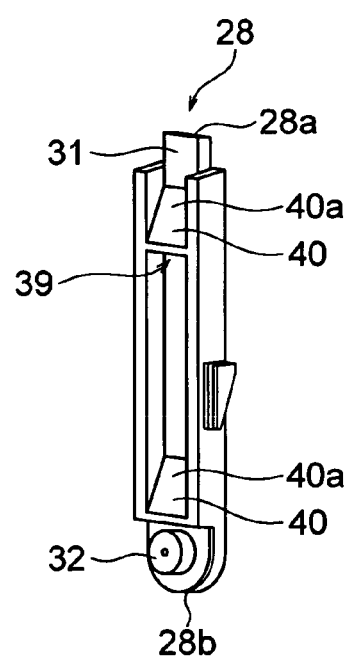
FIG. 4 is a perspective view showing, in schematic form, a lock member of the opening/closing structure according to the present invention.

As shown in FIG. 4, the lock member 28 is formed of a rod member that is rectangular in cross section. The lock member 28 has, at one end 28a, an engagement section 31 that engages in the engagement bore 18 formed in the container body 13, and has, at the other end 28b, a cylindrical connection section 32 that is connected to the link arm member 29.

The engagement section 31 is engaged in the engagement bore 18 by being inserted through the insertion bore 23 formed in the lid body 20 and the engagement bore 18 formed in the container body 13.

Each of the lock members 28 and 28 is slidably disposed between the guide rails 24 and 24 of the recess, with its axis extending in the extending direction of the recess 21. Thereby, each of the lock members 28 and 28 is movable along the guide rail 24 or equivalently in the extending direction of the recess 21.

The engagement and disengagement of the lock members 28 and 28 with and from the container body 13 are accomplished by the insertion and removal, respectively, of the engagement sections 31 and 31 into and from the engagement bores 18 and 18 of the container body 13 by a rectilinear sliding movement of the lock members 28 and 28 along the guide rails 24.

Figure 5:
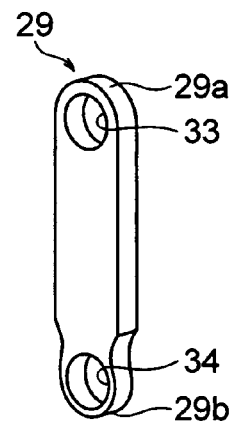
FIG. 5 is a perspective view showing, in schematic form, a link arm member of the opening/closing structure according to the present invention.

As shown in FIG. 5, the link arm member 29 is formed of a rod member that is rectangular in cross section. The link arm member 29 has connection bores 33 and 34 formed therethrough at its ends 29a and 29b, respectively, to which the lock member 28 and the rotation plate 30 are connected, respectively.

The lock member 28 is rotatably connected to the link arm member 29 by the insertion of the connection section 32 into the connection bore 33 of the link arm member 29.

As shown in FIG. 1, each of the rotation plates 30 and 30 is formed of a plate member in substantially circular form, and is rotatably disposed at the center of the recess 21 with a shaft bore 30a, the axis of rotation, journaled on a rotating shaft 21f projecting from the recess 21.

The shaft bore 30a is disposed as being located on a straight line connecting the positions of the engagement sections 31 and 31 as inserted and engaged in the engagement bores 18 and 18 of the container body 13.

Figure 6:
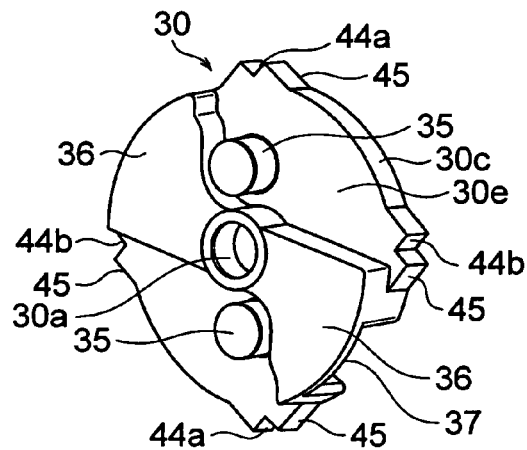
FIG. 6 is a perspective view showing, in schematic form, a rotation plate of the opening/closing structure according to the present invention, as viewed from its rear surface.

As shown in FIG. 6, the rotation plate 30 has a pair of cylindrical connection sections 35 formed on its rear surface 30e, which are rotatably inserted into the connection bores 34 of the link arm members 29.

The connection sections 35 are formed as spaced equidistantly diametrically outwardly from the center of the rotation plate 30. The rotation plate 30 is operated so that its rotating force acts on the lock members 28 through the link arm members 29 as an engaging force exerted in an engagement direction for engagement with the container body 13 or a disengaging force exerted in a disengagement direction for disengagement from the container body 13.

Figure 9:
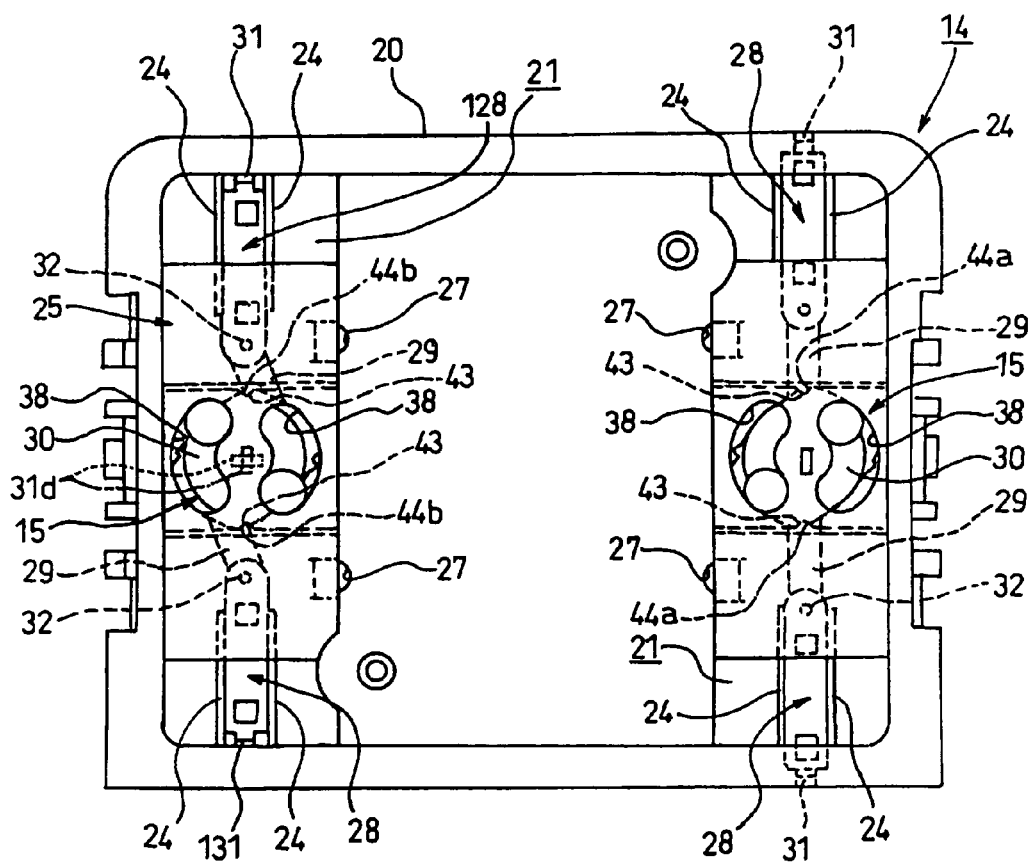
FIG. 9 is a plan view of the configuration of a lid using a lock member of a first embodiment of the opening/closing structure according to the present invention, showing, in the left-hand part thereof, a disengagement rotation position of the rotation plate in a situation where the lock member is in an open position, and showing, in the right-hand part thereof, an engagement rotation position of the rotation plate in a situation where the lock member is in a position as engaged with the container body.
Figure 10:
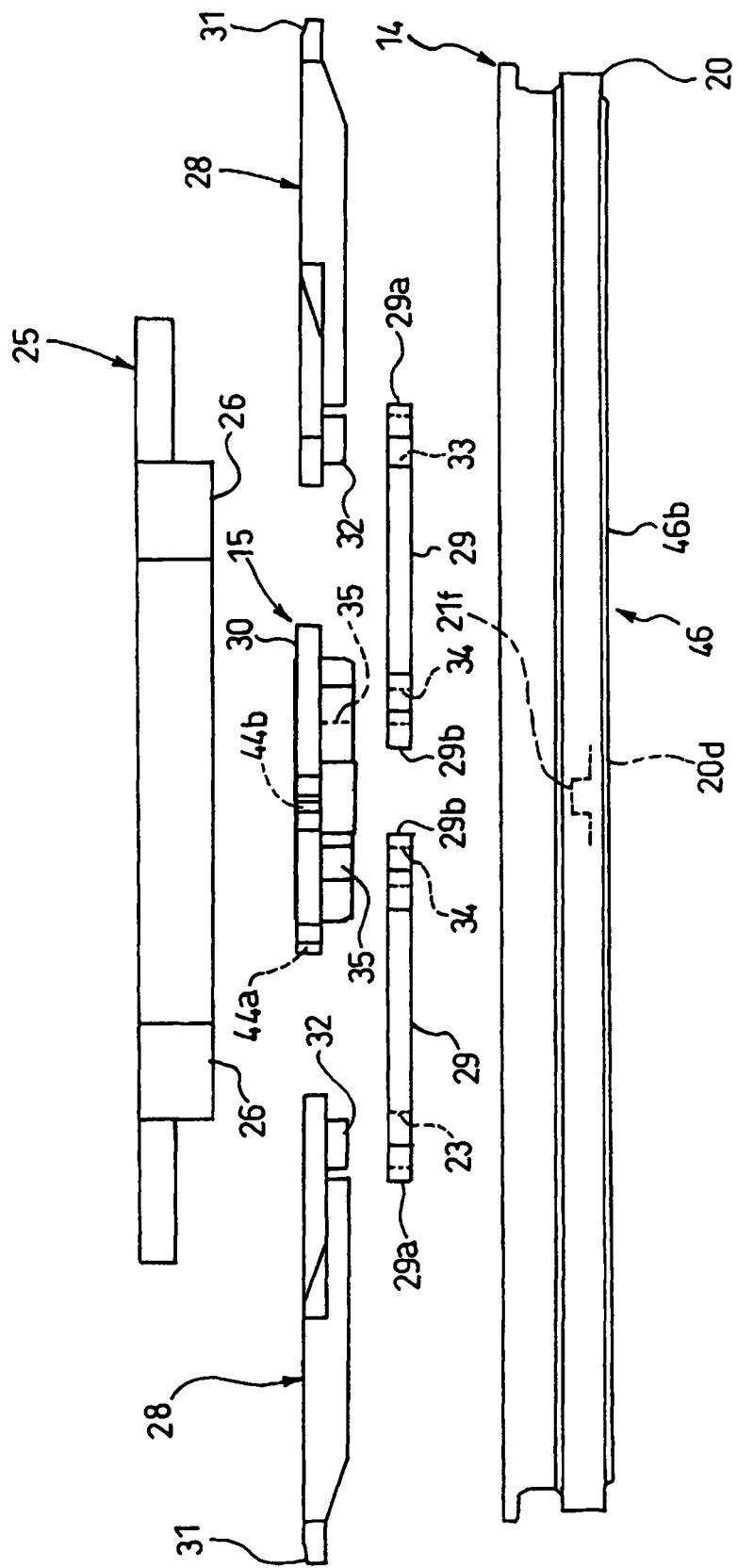
FIG. 10 is an exploded side view explaining the configuration of the lid body of the opening/closing structure according to the present invention.

As shown in the right-hand part of FIG. 9, the positions of the connection sections 35 and 35, at an engagement rotation position, are set so as to lie on the straight line connecting the positions of the engagement sections 31 and 31 as inserted and engaged in the engagement bores 18 and 18 of the container body 13.

As shown in the left-hand part of FIG. 9, the structure is such that rotation of the rotation plate 30 causes rectilinear sliding of the lock members 28 and 28, while causing rotation of the connection sections 35 and 35 in the connection bores 34 and 34 provided in the link arm members 29 and 29.

In other words, the lock members 28 and 28, the link arm members 29 and 29 and the rotation plate 30 constitute a conventionally well known link mechanism.

As shown in FIG. 6, the rotation plate 30 also has abutments 36 formed on its rear surface 30e. At the time of rotation of the rotation plate 30, the link arm members 29 abut against the abutments 36 when the lock members 28 are engaged with the container body 13 and when the lock members 28 are disengaged from the container body 13. This restricts the rotation of the rotation plate 30 when the lock members 28 are engaged with the container body 13 and when the lock members 28 are disengaged from the container body 13.

This results in defining an engagement rotation position and a disengagement rotation position. The engagement rotation position is the rotation position of the rotation plate 30 for engagement of the lock members 28 with the container body 13, and the disengagement rotation position is the rotation position of the rotation plate 30 for disengagement of the lock members 28 from the container body 13.

In other words, the rotation plate 30 is rotatably moved from one to another of the engagement and disengagement rotation positions. In the illustrated embodiment, an angle of rotation between the rotation positions is set at, for example, about 90 degrees.

Figure 7:
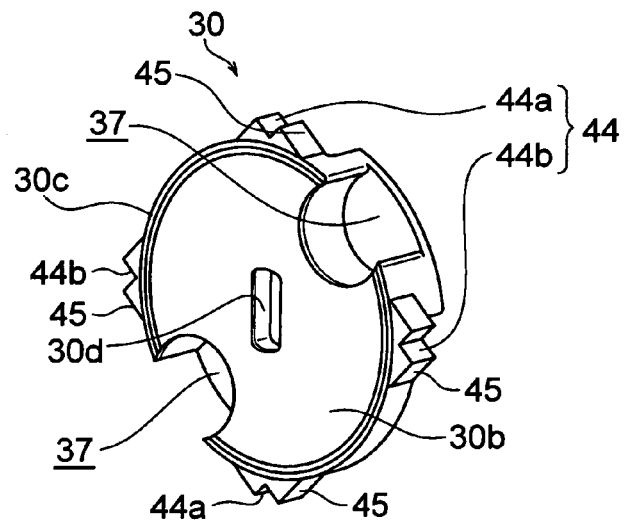
FIG. 7 is a perspective view showing, in schematic form, the rotation plate of the opening/closing structure according to the present invention, as viewed from its front surface.

As shown in FIG. 7, the rotation plate 30 has a key slot 30d formed in its front surface 30b, into which a tool such as a grasp member (not shown) for rotating operation of the rotation plate 30 is inserted.

In the embodiment, the rotation plate 30 further has a pair of finger inserting apertures 37 formed in its front surface 30b, into which the operator's fingers are inserted for manual operation for rotating the rotation plate 30.

As shown in FIG. 3, the cover member 25 that covers the recess 21 has arc-shaped operation bores 38 formed therein along the loci that are made by the finger inserting apertures 37 during rotation of the rotation plate 30. Thereby, the operator can rotate the rotation plate 30 with his or her fingers with the recess 21 covered with the cover member 25.

When the rotation plate 30 rotates in one direction, the lock member 28 moves along the guide rails 24 by being pressed in the engagement direction by the engaging force exerted by the rotation plate 30, and the engagement section 31 of the lock member 28 engages in the engagement bore 18 of the container body 13.

By the engagement of the engagement sections 31 in the engagement bores 18, the lid body 20 as fitted in the opening 12 is unremovably locked to the container body 13.

When the rotation plate 30 rotates in the other direction with the engagement section 31 engaged in the engagement bore 18, the lock member 28 moves along the guide rails 24 by being pulled in the disengagement direction by the disengaging force exerted by the rotation plate 30, and thereby the engagement section 31 is disengaged from the engagement bore 18. Thereby, the lid 14 is disengaged from the container body 13, and thus the lid 14 can be removed from the container body 13, so that the opening 12 of the container body 13 can be opened.

The opening/closing structure 11 for the thin plate-conveying container 10 according to the present invention is provided with a moving device 39, which is disposed between the lid body 20 and the lock member 28. The moving device 39 serves to move the lock member 28 upwardly above the lid 14 as the lock member 28 moves in the engagement direction.

In the embodiment shown in FIGS. 2 and 4, the moving device 39 is configured of a pair of lock member inclined sections 40 and a pair of lid inclined sections 41. The lock member inclined sections 40 are formed, as projecting from the lock member 28, between the engagement section 31 and the connection section 32 of the lock member 28. The lid inclined sections 41 are formed, as projecting from the bottom surface 21d of the recess 21, between the guide rails 24 of the lid body 20, and the sections 41 are engageable with the lock member inclined sections 40 of the lock member 28.

As shown in FIG. 4, the lock member inclined sections 40 formed on the lock member 28 are formed in the vicinities of the engagement section 31 and the connection section 32, respectively, and each have an inclined surface 40a having an angle of elevation in a direction from the one end 28a to the other end 28b of the lock member 28.

As shown in FIG. 2, the lid inclined sections 41 formed on the lid body 20 each have an inclined surface 41a having an angle of elevation equal to that of the inclined surface 40a of the lock member inclined section 40 formed on the lock member 28, in a direction from an inward part to an outward part of the recess 21 along the guide rails 24.

Figure 8B:
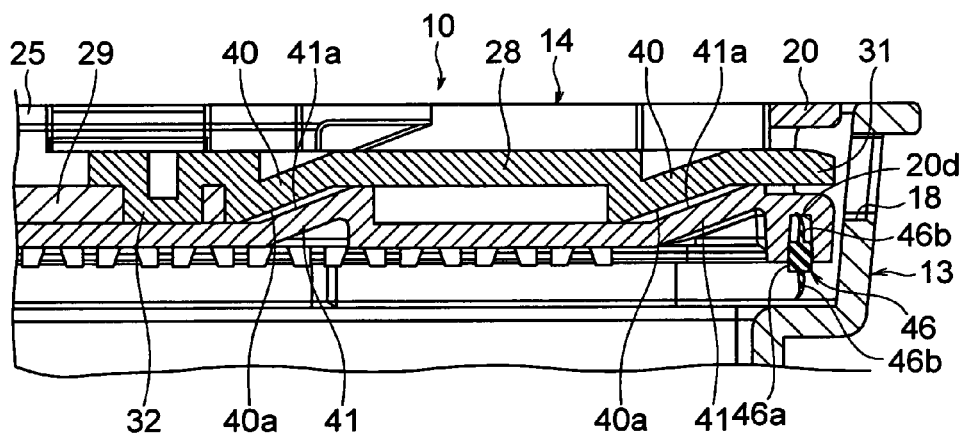
FIG. 8B is a longitudinal sectional view showing the lock member of the opening/closing structure according to the present invention, as being in the midpoint position after having been moved by a moving device.
Figure 8C:
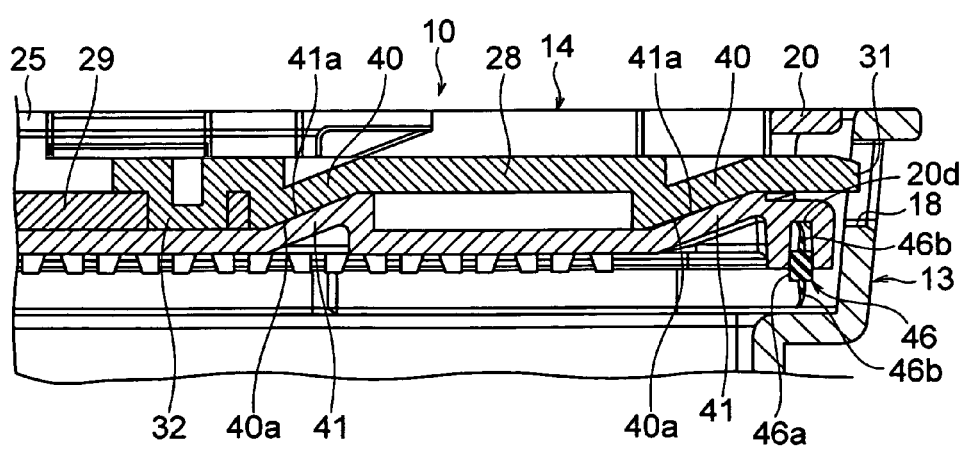
FIG. 8C is a longitudinal sectional view showing the lock member of the opening/closing structure according to the present invention, as being in a position intermediately before being inserted at its end into an engagement bore after having been moved by the moving device.
Figure 8D:
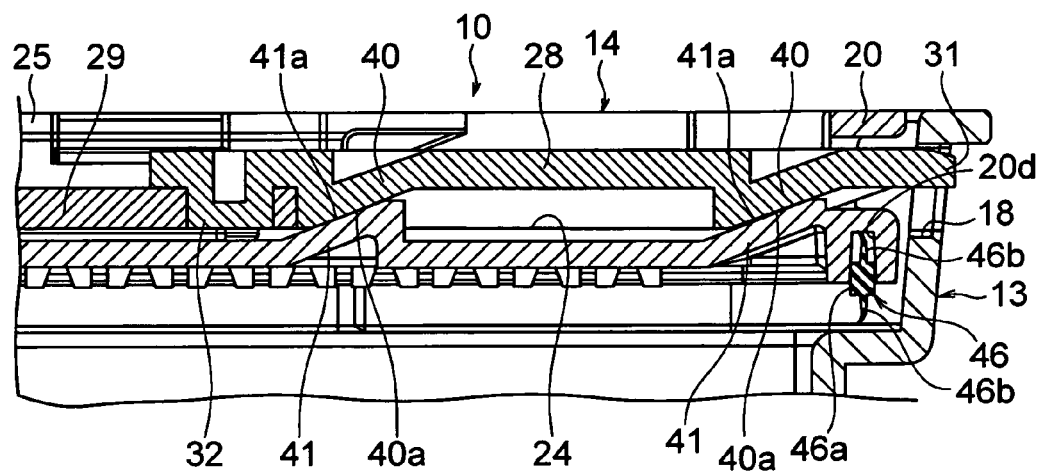
FIG. 8D is a longitudinal sectional view showing the lock member of the opening/closing structure according to the present invention, as being inserted at its end in the engagement bore after having been moved by the moving device.
Figure 8E:
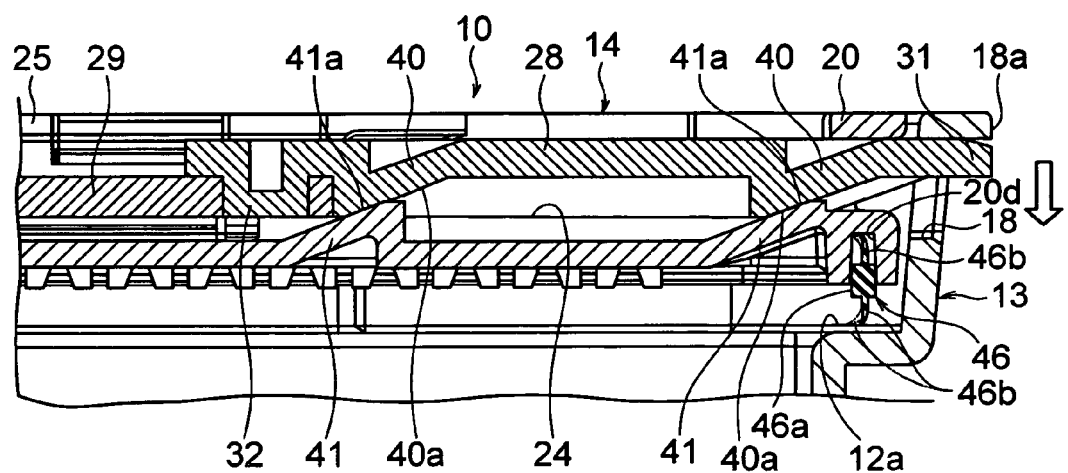
FIG. 8E is a longitudinal sectional view showing the lock member of the opening/closing structure according to the present invention, as being completely inserted at its end in the engagement bore and being engaged with a container body after having been moved by the moving device.

As shown in FIG. 8E, an angle of inclination of the inclined surfaces 40a and 41a of the lock member inclined section 40 and the lid inclined section 41 is set so that, when the engagement section 31 of the lock member 28 is inserted into the engagement bore 18 of the container body 13, the lock member 28 is moved to a level at which the lock member 28 is forced against the upper edge 18a of the engagement bore 18 upwardly above the container body 13.

The vertical size of the engagement bore 18 formed in the sidewall 17 of the container body 13 is set so that the engagement section 31 abuts against the upper edge 18a of the engagement bore 18 when the engagement section 31 is inserted into the engagement bore 18 by movement of the lock member 28 by the moving device 39.

Description will now be given with regard to the function of the opening/closing structure for the thin plate-conveying container according to the first embodiment.

First, when the lock member 28 moves in the engagement direction, the inclined surfaces 40a of the lock member inclined sections 40 formed on the lock member 28 abut against the inclined surfaces 41a of the lid inclined sections 41 formed on the lid body 20 as shown in FIGS. 8A to 8C, and further, the lock member 28 moves obliquely upwardly by sliding along the inclined surfaces as shown in FIGS. 8D and 8E.

At this point, by the obliquely upward movement of the lock member 28, the engagement section 31 of the lock member 28 inserted in the engagement bore 18 of the container body 13 is forced upwardly against the upper edge 18a of the engagement bore 18 as shown in FIG. 8E, based on the fact that the angle of inclination of the inclined surfaces 40a and 41a of the lock member inclined section 40 and the lid inclined section 41 is set as mentioned above.

Thereby, a pressing force is exerted on the lid body 20 by the lock member 28 and acts to press the lid body against the container body 13.

In this instance, the engagement bore 18 is integrally molded with the flange provided on the periphery of the opening 12 of the container body 13, as projecting outwardly and being integral with the periphery, and thus, as shown in FIG. 8A, the area of the upper edge 18a of the inner circumferential surface of the engagement bore 18 is set larger than the areas of the side and lower edges, so that the engagement section 31 of the lock member 28 has an increased pressing area at its top surface.

Thus, the pressing force is effectively transmitted, so that the seals 46b and 46b of the gasket 46 provided in the lid body 20 are forced against the top surface of the groove 20d formed in the lid body 20 and the opening 12 of the container body 13, respectively, and elastically abut against the top surface of the groove 20d and a stepped section 12a of the opening 12 of the container body 13, respectively, while undergoing elastic deformation, as shown by the dash-double dot lines in FIG. 8E.

Therefore, this ensures the sealing between the lid body 20 and the opening 12 of the container body 13.

At this point, the lock members 28 and 28 are guided to make a rectilinear sliding movement, by the pair of the guide rails 24 and 24 formed in the recess 21 of the lid 14.

Accordingly, this enables a further improvement in the reliability of insertion of the engagement section 31 of the lock member 28 into the engagement bore 18 of the container body 13.

As shown in FIG. 1, the opening/closing structure 11 for the thin plate-conveying container 10 according to the present invention is provided with a holding device 42, which is disposed between the rotation plate 30 and the lid 14. The holding device 42 serves to hold the rotation plate 30 at the engagement rotation position of the rotation plate 30 and at the disengagement rotation position thereof.

Of these positions, the engagement rotation position is such that, for the engagement of the lock members 28 and 28 with the container body 13 by rotation of the rotation plate 30, the link arm members 29 and the lock members 28 are stopped as aligned end to end on a straight line including the center of the shaft bore 30a of the rotation plate, as shown in the right-hand part of FIG. 9.

The disengagement rotation position is such that, for the disengagement of the lock members 28 and 28 from the container body 13 by rotation of the rotation plate 30, the lock members 28 and 28 are stopped as removed from the engagement bores 18 of the container body 13 by rectilinearly sliding along the guide rails 24 and 24, as shown in the left-hand part of FIG. 9.

As shown in FIGS. 3 and 7, the holding device 42 according to the first embodiment is configured mainly of a pair of engagement projections 43 formed on a rear surface 25a of the cover member 25 of the lid 14, as projecting from the rear surface; and two pairs of engagement recesses 44a, 44a and 44b, 44b formed at spaced intervals on a periphery 30c of the rotation plate 30, and which are disposed so that the engagement projections 43 and 43 are engageable therewith, respectively. The holding device 42 is configured to stop a rotating movement of the rotation plate 30 both at the engagement rotation position and at the disengagement rotation position.

As shown in FIG. 3, the engagement projections 43 are formed on the cover member 25 in such a manner that the projections 43 are spaced from each other in the extending direction of the cover member 25 and such that the rotation plate 30 is sandwiched on its sides therebetween with the cover member 25 attached to the lid body 20.

In the illustrated embodiment, the engagement projection 43 has a V shape in cross section along the cover member 25, such that the cross section becomes greater farther away from the rotation plate 30.

As shown in FIG. 7, the engagement recesses 44a, 44a and 44b, 44b are formed on the periphery 30c of the rotation plate 30, as located facing the engagement projections 43, at the engagement rotation position of the rotation plate 30 and at the disengagement rotation position thereof.

In the illustrated embodiment, formation of the engagement recesses 44a, 44a and 44b, 44b is accomplished by notching the tips of four triangular sections 45 in triangular form, formed as projecting from the periphery 30c of the rotation plate 30 at diametrically opposite positions of the rotation plate 30.

When the rotation plate 30 rotates to move to the engagement rotation position and to the disengagement rotation position, the engagement projections 43 formed on the cover member 25 engage with the engagement recesses 44a, 44a and 44b, 44b formed on the rotation plate 30, and thereby the rotation plate 30 is stopped and held at the engagement rotation position and at the disengagement rotation position.

As mentioned above, the holding device 42 provided between the rotation plate 30 and the lid 14 is used to hold the rotation plate 30 at the engagement rotation position for the engagement of the lock members 28 with the container body 13 and at the disengagement rotation position for the disengagement of the lock members 28 from the container body 13. This prevents the rotation plate 30 from easily rotating and moving from the engagement rotation position and from the disengagement rotation position, and thus enables maintaining, with stability, the lock members 28 as engaged with the container body 13 and the lock members 28 as disengaged from the container body 13.

Therefore, even if, during conveyance, vibrations are applied to the thin plate-conveying container 10 having a semiconductor wafer accommodated therein, the engagement projections 43 and 43 engage with the engagement recesses 44a and 44a of the rotation plate 30 so that the rotation plate 30 is unrotatably held at the engagement rotation position. This prevents rotation of the rotation plate 30 due to the vibrations. Hence, this enables preventing the disengagement of the lock members 28 from the container body 13 due to the vibrations being applied to the thin plate-conveying container 10.

In the first embodiment, further, the engagement rotation position is such that, for the engagement of the engagement sections 31 and 31 of the lock members 28 and 28 with the peripheries of the engagement bores 18 and 18 of the container body 13, the link arm members 29 and 29 and the lock members 28 and 28 are stopped as aligned end to end on a straight line including the axis of rotation of the rotation plate 30.

Thus, even if external forces are applied to the lock members 28 and 28, the external forces are transmitted in straight lines, as being opposed to cancel each other out, to the connection sections 35 and 35 of the rotation plate 30 through the link arm members 29 and 29, and thus a force that causes rotation of the rotation plate 30 does not develop. This prevents the rotation plate 30 from easily rotating and moving from the engagement rotation position and from the disengagement rotation position.

Hence, this enables maintaining, with higher stability, the lock members 28 and 28 as engaged with the container body 13 and the lock members 28 and 28 as disengaged from the container body 13.

Thus, for example even if, during conveyance, vibration or shock due to falling is applied to the thin plate-conveying container 10 having a semiconductor wafer accommodated therein, the rotation plate 30 is held at the engagement rotation position. This ensures the prevention of rotation and movement of the rotation plate 30 to the disengagement rotation position due to the vibration.

Hence, this prevents the disengagement of the lock members 28 and 28 from the container body 13 due to the vibration being applied to the thin plate-conveying container 10.

The rotation plate 30 is held at the engagement rotation position thereof and at the disengagement rotation position thereof. Thus, when the rotation plate 30 is rotated for the engagement of the lock members 28 with the container body 13 and for the disengagement of the lock members 28 from the container body 13, whether or not the engagement and disengagement of the lock members 28 with and from the container body 13 are completely done can be easily checked by a click made by the lock members being locked or a feeling of click produced by a change in a resisting force under operation.

This prevents the lid 14 from being erroneously removed from the container body 13 with the lock members 28 incompletely disengaged from the container body 13, and thus enables preventing damage to the lock members 28, the container body 13 and the lid 14, such as has been heretofore caused by the lock members 28 being caught in the container body 13 at the time of removal of the lid 14 from the container body 13.

Moreover, the thin plate-conveying container 10 is prevented from being conveyed with the lock members 28 incompletely engaged with the container body 13. This enables preventing a semiconductor wafer from being contaminated due to dust entering the container body 13 due to the lid 14 being removed from the container body 13 during conveyance.

The pair of the link arm members 29 and 29 and the pair of the lock members 28 and 28, which are symmetrically disposed on a straight line including the shaft bore 30a that is the axis of rotation of the rotation plate 30, are aligned end to end, and moreover, the engagement rotation position is such that the positions of the engagement recesses 44a and 44a as engaged with the engagement projections 43 and 43 lie on the straight line connecting the positions of the engagement sections 31 and 31 of the lock members 28 and 28 as engaged in the engagement bores 18 and 18 of the container body 13.

In the first embodiment, moreover, the lock members 28 and 28 are guided to make a rectilinear sliding movement, by the pair of the guide rails 24 and 24 formed in the recess 21 of the lid 14. Thus, the link arm members 29 and 29 can be aligned end to end on an extension line of the lock members 28 and 28 without being bent at the connection sections 32 and 32.

This leads to the application of a circumferential force that causes rotation of the rotation plate 30, required for the disengagement of the engagement projections 43 and 43 from the engagement recesses 44a and 44a, and forces transmitted from the lock members 28 and 28 through the link arm members 29 and 29 in a radial direction that is a substantially perpendicular direction.

At this point, the link arm members 29 and 29 are stretched and thus inhibit even movement of the lock member 28 from the engagement section 31 toward the shaft bore 30a of the rotation plate 30.

Therefore, this achieves a further reduction in the likelihood of the disengagement of the engagement projections 43 and 43 from the engagement recesses 44a and 44a by external forces.

Moreover, for example even if, due to falling, external forces are transmitted from the pair of the link arm members 29 and 29 and the pair of the lock members 28 and 28 symmetrically disposed and are simultaneously applied from opposite directions with respect to the shaft bore 30a of the rotation plate 30, these external forces act in the directions in which they cancel each other out. This achieves a further reduction in the likelihood of the disengagement of the engagement projections 43 and 43 from the engagement recesses 44a and 44a.

The holding device is configured of the engagement projections 43 and 43 formed on the lid 14, and the engagement recesses 44a, 44a and 44b, 44b with which the engagement projections 43 and 43 are engageable. The engagement recesses 44a, 44a and 44b, 44b are formed at spaced intervals on the circumferential surface of the rotation plate 30, as located facing the engagement projections 43 and 43, at the engagement rotation position of the rotation plate 30 and at the disengagement rotation position thereof. The engagement recesses 44a, 44a and 44b, 44b are easily formed merely by notching the tips of the four triangular sections 45 into recess form. This eliminates the need for using a complicated lock mechanism and thus enables improving the reliability and durability of operation.

As mentioned above, the engagement recesses 44a, 44a and 44b, 44b of the holding device 42 are formed on the periphery 30c of the rotation plate 30, by notching the tips of the four triangular sections 45 in triangular form, formed as projecting from the periphery 30c diametrically of the rotation plate 30. Thus, the engagement projections 43 interfere with the rotation plate 30 only when engaging with the engagement recesses 44a, 44a and 44b, 44b, and do not interfere with the rotation plate 30 between the engagement rotation position and the disengagement rotation position of the rotation plate 30. This enables preventing a decrease in the efficiency of rotation of the rotation plate 30 due to frictional forces developed between the engagement projections 43 and the rotation plate 30 due to the engagement projections 43 interfering with the periphery 30c of the rotation plate during rotation of the rotation plate 30.

As mentioned above, by the moving function of the moving device 39 provided between the lid 14 and the lock member 28, the lock member 28 as inserted in the engagement bore 18 formed in the container body 13 is forced against the upper edge 18a of the engagement bore 18 within the engagement bore 18, and thereby the pressing force is exerted on the lid 14 by the lock member 28 and acts to press the lid 14 against the container body 13.

Thus, the lock mechanism 15 according to the first embodiment has both the function of preventing the erroneous removal of the lid 14 and the function of bringing the lid 14 into more intimate contact with the container body 13 with the opening 12 of the container body 13 closed with the lid 14.

Therefore, the opening 12 of the container body 13 is hermetically closed with the lid 14 with reliability merely by rotation of the rotation plate 30.

As mentioned above, further, the groove 20d of the lid body 20 is provided therein with the ring-shaped gasket 46 for providing the sealing between the lid body 20 and the opening 12 of the container body 13. This enables providing the sealing between the lid body 20 and the container body 13 with higher reliability.

Specifically, the ring-shaped gasket 46 is pressed upwardly and downwardly by the pressing force developed by abutment between the top surface of the engagement section 31 of the lock member 28 inserted in the engagement bore 18 and the upper edge 18a of the inner circumferential surface of the engagement bore 18, and thereby, while undergoing elastic deformation, the gasket 46 is forced against the top surface of the groove 20d formed in the lid body 20 and the opening 12 of the container body 13, so that sealing is provided between the lid 14 and the opening 12 of the container body 13.

This enables more reliably preventing dust from entering the container body 13 from between the lid 14 and the container body 13.

As mentioned above, moreover, the rotation plate 30 has the pair of finger inserting apertures 37 formed in its front surface 30b, into which the fingers of the operator who performs the rotating operation of the rotation plate are inserted.

Conventionally, the rotating operation of the rotation plate 30 has involved inserting the tool into the key slot 30d, and rotating the tool by operator's manual operation or by use of a machine such as a robot, thereby rotating the rotation plate 30. At a place where there is no provision of the tool and machine intended for the purpose, however, the rotating operation of the rotation plate 30 can possibly become difficult and encounter a problem.

Moreover, it is necessary to form the grasp member designed specifically for the rotating operation of the rotation plate 30, aside from the rotation plate 30. This results in an increase in a parts count.

As opposed to this, according to the embodiment, the rotation plate 30 has the pair of finger inserting apertures 37 formed in its front surface 30b, as mentioned above. Thus, for the rotation of the rotation plate 30 for the engagement and disengagement of the lock members 28 with and from the container body 13, the rotation plate 30 can be easily rotated by the operator's fingers without the use of the tool and machine and the like designed specifically for rotation of the rotation plate 30 and also without the increase in the parts count resulting from addition of the grasp member designed specifically for manual rotation of the rotation plate.

As mentioned above, further, the recess 21 of the lid body 20 has the plural disengagement recesses 27 formed in its opening edge 21e, which serve for the disengagement of the engagement pawls 26 from the engagement holes 22. The inside diameter of the disengagement recess 27 is such that it permits the insertion of the operator's finger.

Thus, for the removal of the cover member 25 from the lid body 20, the disengagement of the engagement pawl 26 from the engagement hole 22 can be easily accomplished by inserting, for example, the finger into the disengagement recess 27, pressing the engagement pawl 26 into the recess 21, and thereby causing elastic deformation in the engagement pawl 26 engaged in the engagement hole 22. For cleaning of the lid 14, therefore, the lid 14 can be disassembled for cleaning of each individual structural component of the lid 14.

In the first embodiment, moreover, the lock mechanism has a simple structure in which the pair of the link arm members 29 and 29 are engaged with and journaled on the connection sections 35 and 35 of the rotation plate 30 and the connection sections 32 and 32 of the lock members 28 and 28. Thus, disassembly and assembly are easily done merely by removing the cover member 25.

Moreover, the connection sections 32, 32 and 35, 35 can be set so that their peripheral abrading portions each have a small area. This enables achieving a reduction in the occurrence of dust due to a low-friction place becoming extremely small during opening/closing operation.

In the first embodiment, moreover, the pair of the engagement projections 43 and 43 that alternately engage with the engagement recesses 44a, 44a and 44b, 44b are oppositely disposed with respect to the shaft bore 30a so that the rotation plate 30 is unrotatably held by two points of engagement.

This makes it easier to hold the engagement rotation position and the disengagement rotation position. At the engagement rotation position, there is a reduced likelihood of the lock members 28 and 28 being unlocked. Even if either one of the engagement projections 43 cannot engage with the engagement recesses 44a and 44b due to wear or the like, the other engagement projection 43 engages therewith and thus enables holding the engagement rotation position and the disengagement rotation position.

Therefore, the reliability of operation can be improved also in this respect.

[Second Embodiment]

Figure 11:
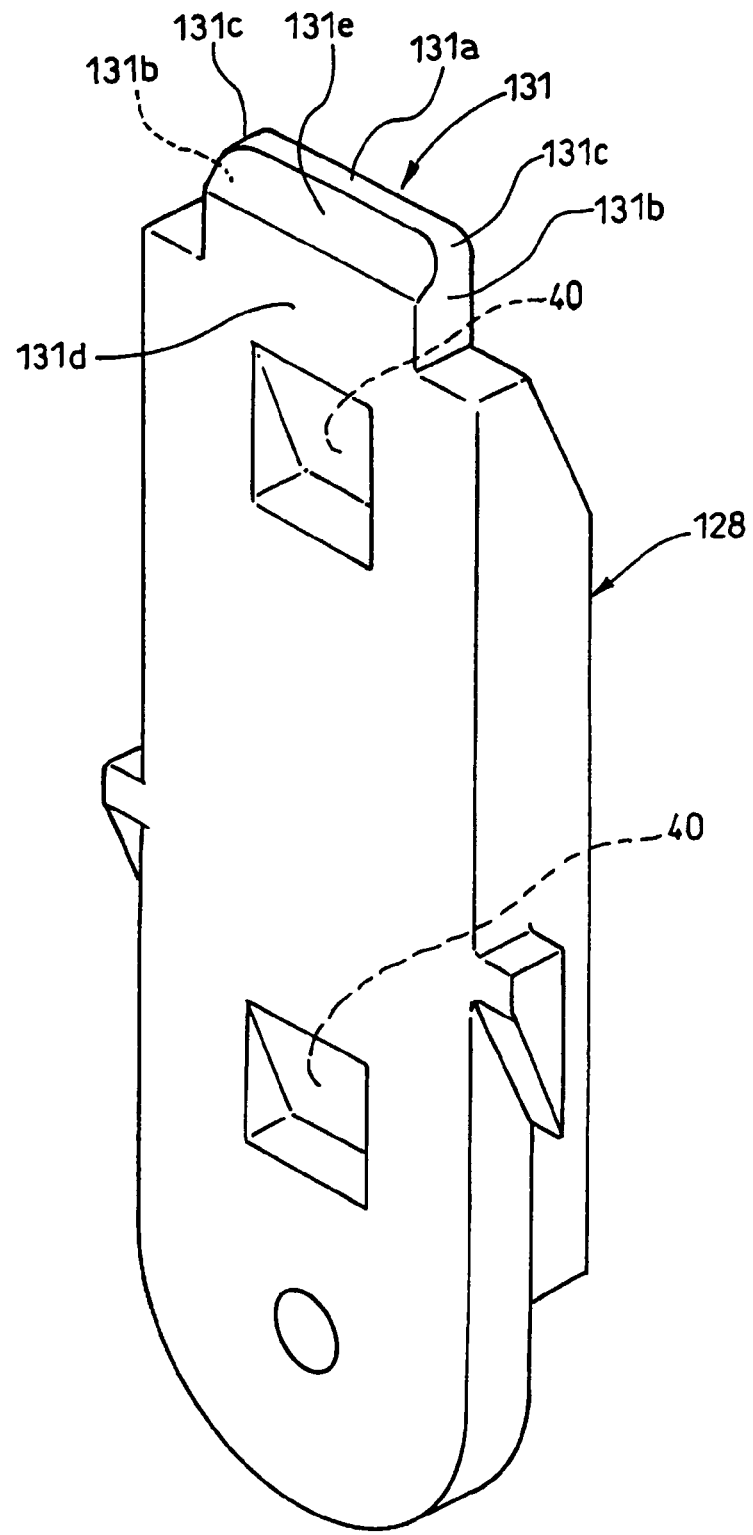
FIG. 11 is a perspective view explaining the configuration of a lock member of a second embodiment of the opening/closing structure according to the present invention.
Figure 12:
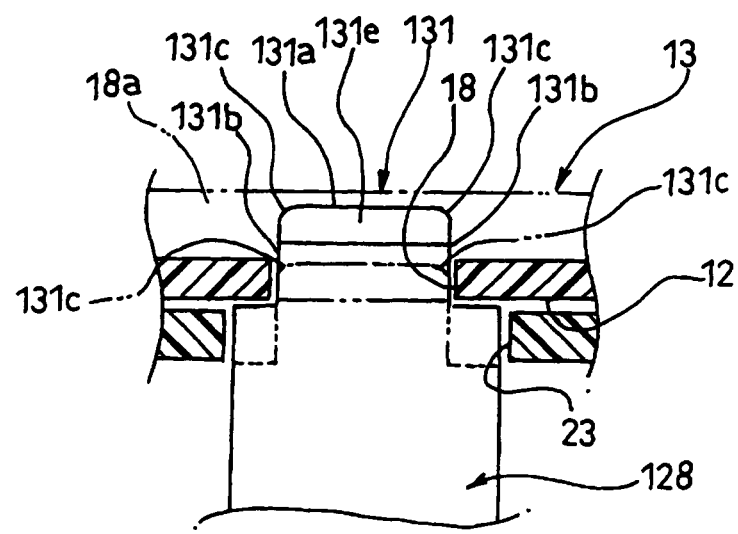
FIG. 12 is an enlarged horizontal sectional view explaining the insertion and removal of the lock member into and from the engagement bore of the container body, showing the structure using the lock member of the second embodiment of the opening/closing structure according to the present invention, as viewed in a place corresponding to an area indicated by "G" in FIG. 13.
Figure 13:
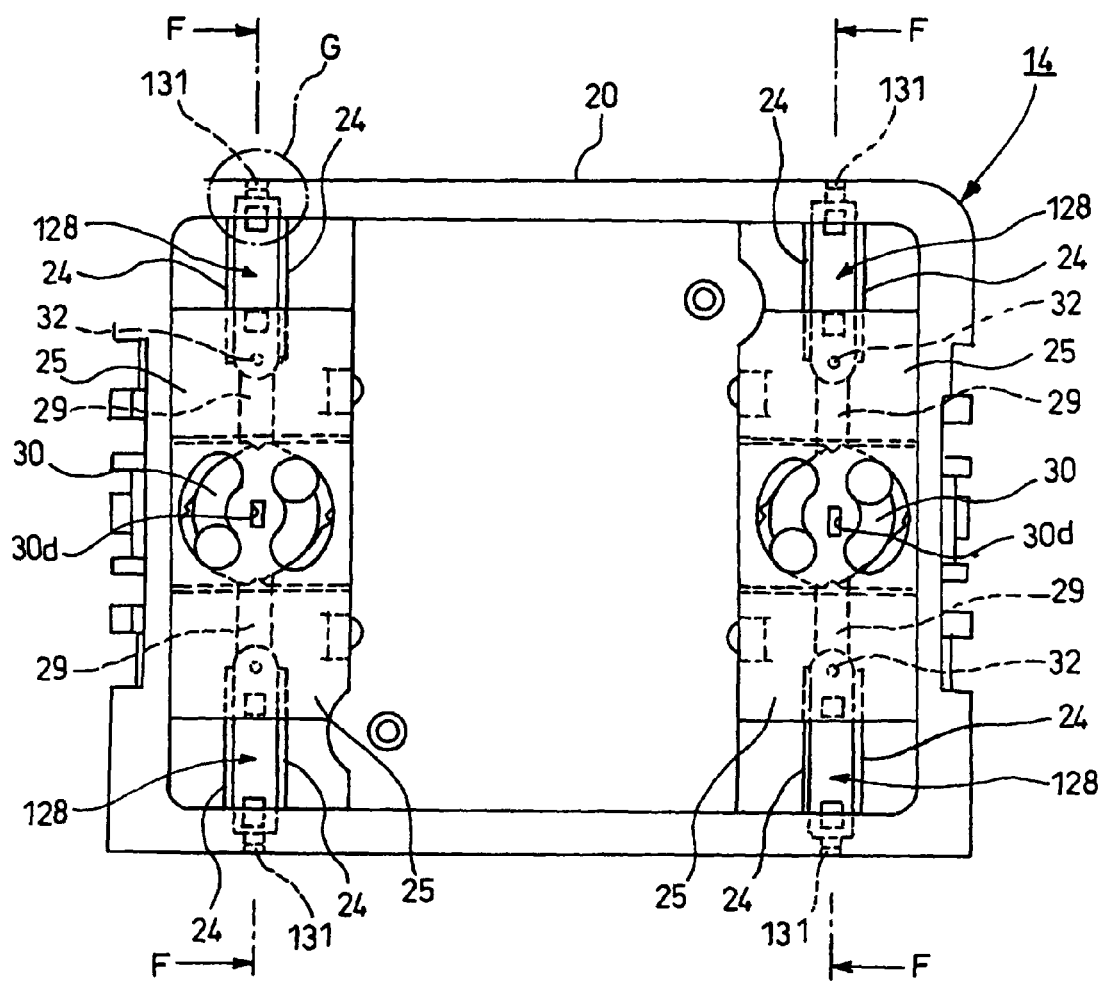
FIG. 13 is a plan view explaining the lid body as subjected to centering with respect to the container body by the lock member, showing the configuration using the lock member of the second embodiment of the opening/closing structure according to the present invention.

FIGS. 11 to 13 show an opening/closing structure for a thin plate-conveying container according to the second embodiment for carrying out the best mode of this invention.

Incidentally, the same or equivalent parts as or to those of the first embodiment are designated by the same reference numerals for explanation.

In a lock member 128 for use in the opening/closing structure for the thin plate-conveying container according to the second embodiment, an engagement section 131 that is inserted into the engagement bore 18 of the container body 13 is provided with a centering mechanism.

As shown in FIG. 12, the centering mechanism includes guide curved surfaces 131c and 131c, which are formed in arc shape at corners between an end surface 131a of the engagement section 131 and right and left side surfaces 131b and 131b thereof.

A tapered surface 131e formed of a chamfer is formed at a top corner between the end surface 131a of the engagement section 131 and a top surface 131d thereof.

In the opening/closing structure for the thin plate-conveying container according to the second embodiment configured in this manner, the engagement section 131 has the arc-shaped guide curved surfaces 131c and 131c and the tapered surface 131e, as shown in FIG. 12. Thus, when the end surface 131a of the engagement section 131 is inserted into the engagement bore 18 of the container body 13, the insertion of the engagement section 131 is guided by the guide curved surfaces 131c and 131c and the tapered surface 131e so that the engagement section 131 can be smoothly inserted into a right engagement position.

This enables improving the accuracy of fitting of the right and left side surfaces 131b and 131b and the top surface 131d of the engagement section 131 against the inner periphery of the engagement bore 18.

As shown by the arrows in FIG. 13, when the engagement sections 131 and 131 of the lock members 128 and 128 are inserted into the engagement bores 18 and 18, the lid body 20 is attached to the container body 13, while being subjected to centering with respect to the container body 13 in the direction indicated by the arrows F.

This enables more accurate setting of the holding position of a semiconductor wafer or the like as a thin plate to be held within the container body 13.

The lock members 128 and 128 of a lock mechanism according to the second embodiment also have a positioning function, in addition to the function of preventing the erroneous removal of the lid 14 and the function of bringing the lid 14 into more intimate contact with the container body 13 with the opening 12 of the container body 13 closed with the lid 14.

Since other structures and functional effects are the same as or equivalent to those of the first embodiment, description thereof is omitted.

Although the embodiments of the present invention have been described in detail above with reference to the accompanying drawings, it is to be understood that specific structures are not limited to these embodiments, and it is intended to cover in the invention such design changes as do not depart from the spirit and scope of the invention.

In the first embodiment, there is given an instance where the engagement projections 43 are formed on the cover member 25 and the engagement recesses 44a, 44a and 44b, 44b with which the engagement projections 43 engage are formed on the rotation plate 30. Instead of this, however, a structure may be such that the engagement projections are formed on the rotation plate 30 and the engagement recesses with which the engagement projections engage are formed on the cover member 25.

Given is an instance where the engagement projections 43 of the holding device 42 are formed on the cover member 25. Instead of this, however, the engagement projections 43 may be formed for example on the circumferential wall of the recess 21 of the lid body 20.

Furthermore, the cover member 25, the lock member 28, the link arm member 29 and the rotation plate 30 may be molded of a resin material such as polycarbonate, polybutylene terephthalate, and polyetheretherketone.

Moreover, polyacetal, a fluorocarbon resin, silicone, or the like may be mixed into the above-mentioned resin material in order to improve the slidability of the lock member 28, the link arm member 29 and the rotation plate 30.

Furthermore, glass fiber, carbon fiber, or the like may be mixed into the above-mentioned resin material in order to increase the strength of the cover member 25, the lock member 28, the link arm member 29 and the rotation plate 30.

In addition to the above-mentioned effects of the present invention, the following effects are achieved. The pair of the link arm members and the pair of the lock members are aligned end to end as being symmetrically disposed on a straight line including the axis of rotation of the rotation plate. Moreover, the engagement rotation position is such that the positions of the engagement recesses of the holding device as engaged with the engagement projections lie on the straight line connecting the positions of the lock members as engaged with the container body. This leads to the application of the force that causes rotation of the rotation plate, required for the disengagement of the engagement projections from the engagement recesses, and the forces transmitted from the lock members through the link arm members in the substantially perpendicular direction. This achieves a further reduction in the likelihood of the disengagement of the engagement projections from the engagement recesses by external forces.

Moreover, even if external forces are applied from opposite directions with respect to the axis of rotation of the rotation plate by the pair of the link arm members and the pair of the lock members symmetrically disposed, these external forces act in the directions in which they cancel each other out. This achieves a further reduction in the likelihood of the disengagement of the engagement projections from the engagement recesses.

The holding device can be easily configured of the engagement projections formed on the lid, and the engagement recesses with which the engagement projections are engageable, which are formed on the rotation plate, as located facing the engagement projections, at the engagement rotation position of the rotation plate and at the disengagement rotation position thereof. This eliminates the need for using a complicated lock mechanism and thus enables improving the reliability of operation.

With the above structure, furthermore, the lock members are rectilinearly slidably guided from the axis of rotation of the rotation plate by a guide device provided in the lid.

This enables an improvement in the reliability of the engagement of the lock members with the container body because of achieving rectilinear engagement with the container body.

As mentioned above, moreover, there is provided the moving device disposed between the lid and the lock member, which serves to move the lock member upwardly above the lid as the lock member moves toward the container body when the engaging force is exerted on the lock member by the rotation plate. By the moving function of the moving device, the lock member as inserted in the engagement bore formed in the container body is forced against the edge of the engagement bore within the engagement bore.

Thus, the pressing force is exerted on the lid by the lock member and acts to press the lid against the container body, so that the lid can be brought into more intimate contact with the container body with the gasket in between with the opening of the container body closed with the lid.

With the above structure, furthermore, the inclined sections provided between the engagement section and the connection section of the lock member are brought into sliding engagement with the inclined sections formed as projecting from the bottom surface of the lid. The engagement section of the lock member is forced against the edge of the engagement bore within the engagement bore by using a force by which the lock member is inserted into the engagement bore formed in the container body.

Thus, the pressing force is exerted on the lid by the lock member and acts to press the lid against the container body, merely by rotation of the rotation plate for the insertion of the lock member into the engagement bore, without having to add a press-fit mechanism for closing the opening of the container body with the lid. This can ensure that the opening of the container body is hermetically closed with the lid.

Moreover, the engagement section has the arc-shaped guide curved surfaces and the tapered surface. Thus, when the end surface of the engagement section is inserted into the engagement bore of the container body, the insertion of the engagement section is guided by the guide curved surfaces and the tapered surface so that the engagement section can be smoothly inserted into the right engagement position.

This enables improving the accuracy of fitting of the right and left side surfaces and the top surface of the engagement section against the inner periphery of the engagement bore.

Thus, when the engagement sections of the lock members are inserted into the engagement bores, the lid is attached to the container body, while being subjected to centering with respect to the container body.

This enables more accurately setting the holding position of a semiconductor wafer or the like as a thin plate to be held within the container body.

Moreover, the ring-shaped gasket is pressed upwardly and downwardly by the pressing force developed by the abutment between the top surface of the engagement section of the lock member inserted in the engagement bore and the upper edge of the inner circumferential surface of the engagement bore, and thereby, the gasket elastically abuts against the members while undergoing elastic deformation, so that sealing is provided between the lid and the opening of the container body.

This enables more reliably preventing dust from entering the container body from between the lid and the container body.

With the above structure, furthermore, the rotation plate has the finger inserting apertures into which the fingers of the operator who performs the rotating operation of the rotation plate are inserted. Thus, for the rotation of the rotation plate for the engagement and disengagement of the lock members with and from the container body, the rotation plate can be easily rotated by hand without the use of the tool and machine (e.g., the robot) and the like designed specifically for rotation of the rotation plate.

This enables suppressing the increase in the parts count resulting from addition of, for example, the grasp member for manual rotation of the rotation plate.

With the above structure, moreover, the cover member that covers the lock mechanism accommodated in the recess of the lid body has the elastically deformable engagement pawls that engage, within the recess, in the engagement holes formed in the circumferential surface of the recess. The recess of the lid body has the disengagement recesses formed in its opening edge, which serve for the disengagement of the engagement pawls from the engagement holes. Thus, the disengagement of the engagement pawl from the engagement hole can be easily accomplished by inserting, for example, the finger into the disengagement recess, pressing the engagement pawl into the recess, and thereby causing elastic deformation in the engagement pawl engaged in the engagement hole.

This facilitates the assembly and disassembly of the opening/closing structure members into and from the lid body. For cleaning of the lid, therefore, the lid can be disassembled for cleaning of each individual structural component of the lid.

INDUSTRIAL APPLICABILITY

In the above embodiments, the opening/closing structure for the thin plate-conveying container according to the present invention is applied to the thin plate-conveying container for a semiconductor wafer or the like. However, this opening/closing structure is not limited to the thin plate-conveying container but may be applied to various containers for accommodation.

The invention claimed is:

1. An opening/closing structure for a thin plate-conveying container, comprising:
   a container body having an opening;
   a lid removably attached to the container body for closing the opening of the container body;
   a lock mechanism on the lid for locking the lid to the container body with the opening of the container body closed, the lock mechanism including:
      a link mechanism including a rotation plate having an axis of rotation and being rotatably mounted on the lid, a lock member configured to releasably engage the container body, and a link arm member to connect the rotation plate to the lock member to exert on the lock member a rotating force of the rotation plate as an engaging force for engaging the lock member with the container body and as a disengaging force for disengaging the lock member from the container body; and
      a holding device for holding the rotation plate in a stopped state and thereby preventing rotation of the rotation plate both at an engagement position, at which the lock member is engaged with the container body due to the rotation of the rotation plate, and at a disengagement position, at which the lock member is disengaged from the container body due to the rotation of the rotation plate, the holding device including a pair of engagement recesses spaced apart on a periphery of the rotation plate, and including a pair of engagement projections projecting from the lid, the pair of engagement recesses and the pair of engagement projections being arranged so that a first one of the pair of engagement projections engages with a first one of the pair of engagement recesses when the rotation plate is in the engagement position, and so that a second one of the pair of engagement projections engages with a second one of the pair of engagement recesses when the rotation plate is in the disengagement position;
   wherein the lock member is movably disposed between the engagement position at which the lock member is engaged with the container body and the disengagement position at which the lock member is disengaged from the container body, the container body has formed therein an engagement bore for receiving the lock member inserted therein and engaged therewith; and
   a moving device for moving the lock member upwardly above the lid while the lock member maintains a horizontal orientation as the lock member moves toward the container body, the moving device being located between the lid and the lock member, the moving device being configured to force the lock member being inserted in the engagement bore against an edge of the engagement bore within the engagement bore so that a pressing force is exerted on the lid by the lock member to press the lid against the container body.

2. The opening/closing structure for the thin plate-conveying container according to claim 1, wherein at the engagement position at which the lock member is engaged with the container body, the link arm member and the lock member are stopped as aligned end to end on a straight line including the axis of rotation of the rotation plate.

3. The opening/closing structure for the thin plate-conveying container according to claim 1, wherein the holding device further includes a second link arm member to form a pair of link arm members and a second lock member to form a pair of the lock members, the pair of link arm members and the pair of lock members being symmetrically disposed with respect to the axis of rotation of the rotation plate, and at the engagement position, the position of the first one of the pair of engagement recesses holding the rotation plate lies on a straight line connecting the positions of the pair of the lock members engaged with the container body.

4. The opening/closing structure for the thin plate-conveying container according to claim 1, wherein the lid is provided with a guide device that rectilinearly slidably guides the lock member from the axis of rotation of the rotation plate.

5. The opening/closing structure for the thin plate-conveying container according to claim 1, wherein the moving device has inclined sections that are provided between an engagement section and a connection section of the lock member, the inclined sections being formed to project from the lock member, and the moving device further has inclined sections that project from a bottom surface of the lid and are engageable with the inclined sections of the lock member.

6. The opening/closing structure for the thin plate-conveying container according to claim 1, further comprising a centering mechanism configured of guide curved surfaces in arc shape formed at corners between an end surface of the engagement section of the lock member inserted into the engagement bore and right and left side surfaces of the engagement section, and a tapered surface formed at a top corner between the end surface of the engagement section and a top surface thereof

7. The opening/closing structure for the thin plate-conveying container according to claim 1, further comprising a ring-shaped gasket for sealing between the lid and the opening of the container body by undergoing elastic deformation by being pressed upwardly and downwardly by abutment between the top surface of the engagement section of the lock member inserted in the engagement bore and an upper edge of an inner circumferential surface of the engagement bore.

8. The opening/closing structure for the thin plate-conveying container according to claim 1, wherein the rotation plate has a finger inserting aperture formed therein, into which a finger of an operator who performs rotating operation of the rotation plate is inserted.

9. The opening/closing structure for the thin plate-conveying container according to claim 1, wherein the lid includes a lid body having formed therein a recess that accommodates the lock mechanism, and a cover member that covers the lock mechanism accommodated in the recess, the cover member has formed thereon an elastically deformable engagement pawl that engages, within the recess, in the engagement hole formed in a circumferential surface of the recess, the lid body further has a disengagement recess for disengaging the engagement pawl from the engagement hole, and the disengagement recess is formed in an opening edge of the recess, as being opened inwardly of the disengagement recess and upwardly of the lid body.

10. The opening/closing structure for the thin plate-conveying container according to claim 1, wherein the lid has a longitudinal recess, the lock mechanism being accommodated within the longitudinal recess, the lid including a cover member for covering the longitudinal recess, the engagement projections projecting from the cover member of the lid so as to face each other.

11. The opening/closing structure for the thin plate-conveying container according to claim 1, wherein the pair of engagement recesses comprises a first pair of engagement recesses, the holding device further including a second pair of engagement recesses spaced apart on a periphery of the rotation plate such that the first pair of engagement recesses and the second pair of engagement recesses are evenly spaced apart around the periphery of the rotation plate, and so that the first one of the first pair of engagement recesses faces a first one of the second pair of engagement recesses, and the second one of the first pair of engagement recesses faces a second one of the second pair of engagement recesses.

* * * * *